US009903559B2

(12) United States Patent
Hsu

(10) Patent No.: US 9,903,559 B2
(45) Date of Patent: Feb. 27, 2018

(54) LIGHTING APPARATUS AND LENS STRUCTURE THEREOF

(71) Applicant: Lextar Electronics Corporation, Hsinchu (TW)

(72) Inventor: Han-Chung Hsu, Taoyuan (TW)

(73) Assignee: Lextar Electronics Corporation (TW)

( * ) Notice: Subject to any disclaimer, the term of this patent is extended or adjusted under 35 U.S.C. 154(b) by 177 days.

(21) Appl. No.: 14/847,682

(22) Filed: Sep. 8, 2015

(65) Prior Publication Data

US 2016/0312976 A1    Oct. 27, 2016

(30) Foreign Application Priority Data

Apr. 21, 2015 (TW) .............................. 104112731 A

(51) Int. Cl.
| | |
|---|---|
| F21V 5/04 | (2006.01) |
| F21V 8/00 | (2006.01) |
| H01L 33/58 | (2010.01) |
| F21V 7/00 | (2006.01) |
| F21V 5/00 | (2018.01) |
| F21Y 115/10 | (2016.01) |

(52) U.S. Cl.
CPC .............. *F21V 5/04* (2013.01); *F21V 7/0091* (2013.01); *G02B 6/0001* (2013.01); *H01L 33/58* (2013.01); *F21V 5/002* (2013.01); *F21V 5/004* (2013.01); *F21Y 2115/10* (2016.08)

(58) Field of Classification Search
CPC .......... F21V 5/002; F21V 5/003; F21V 5/004; F21V 5/005; F21V 5/04; H01L 2224/48091
See application file for complete search history.

(56) References Cited

U.S. PATENT DOCUMENTS

| | | | |
|---|---|---|---|
| 7,798,679 B2 | 9/2010 | Kokubo et al. | |
| 2007/0024990 A1* | 2/2007 | Paek ................. | G02B 6/0018 |
| | | | 359/725 |
| 2009/0219716 A1 | 9/2009 | Weaver et al. | |

(Continued)

FOREIGN PATENT DOCUMENTS

| | | |
|---|---|---|
| JP | 2008512706 A | 4/2008 |
| JP | 2009211990 A | 9/2009 |

(Continued)

*Primary Examiner* — Jong-Suk (James) Lee
*Assistant Examiner* — Zheng Song
(74) *Attorney, Agent, or Firm* — Hayes Soloway PC

(57) ABSTRACT

A lighting apparatus includes a circuit board, a lighting element and a lens structure. The lighting element is disposed on the circuit board. The lighting element includes a lighting top surface and a lighting lateral surface adjoined to the lighting top surface and the circuit board. The lighting top surface has a center and an optical axis passing through the center. The lens structure covers the lighting element to receive a light from the lighting element. The lens structure includes an outer surface having a total reflection portion and a light outgoing portion surrounding the total reflection portion. The optical axis passes through the total reflection portion. The total reflection portion is configured to totally reflect a portion of light from the center. The light outgoing portion is configured to allow another light emitted from the center to leave away from the lens structure.

15 Claims, 6 Drawing Sheets

(56) References Cited

U.S. PATENT DOCUMENTS

| | | | |
|---|---|---|---|
| 2010/0014281 A1* | 1/2010 | Kim | H01L 33/54 362/97.2 |
| 2010/0188609 A1* | 7/2010 | Matsuki | G02B 19/0014 349/64 |
| 2011/0127903 A1* | 6/2011 | Yao | H01L 33/54 313/498 |
| 2012/0126261 A1 | 5/2012 | Shimizu | |
| 2013/0307400 A1 | 11/2013 | Hartwig et al. | |
| 2014/0078726 A1* | 3/2014 | Tsai | F21V 5/005 362/218 |
| 2014/0168999 A1* | 6/2014 | Li | F21V 5/045 362/338 |
| 2014/0177208 A1* | 6/2014 | Lin | F21V 5/04 362/97.3 |
| 2014/0320781 A1* | 10/2014 | Park | G02F 1/133603 349/61 |
| 2016/0138778 A1* | 5/2016 | Jung | G02B 19/0061 362/97.1 |

FOREIGN PATENT DOCUMENTS

| | | |
|---|---|---|
| JP | 2010140769 A | 6/2010 |
| JP | 2010147447 A | 7/2010 |
| JP | 2012003845 A | 1/2012 |
| JP | 2012244070 A | 12/2012 |
| JP | 2013021136 A | 1/2013 |
| TW | 201248075 A | 12/2012 |
| TW | 201315941 A | 4/2013 |
| TW | M492444 U | 12/2014 |
| WO | 2008096714 A1 | 8/2008 |
| WO | 2012095242 A1 | 7/2012 |

\* cited by examiner

LIGHTING APPARATUS AND LENS STRUCTURE THEREOF

RELATED APPLICATIONS

This application claims priority to Taiwanese Application Serial Number 104112731, filed Apr. 21, 2015, which is herein incorporated by reference.

BACKGROUND

Technical Field

The present invention relates to a lighting apparatus. More particularly, the present invention relates to a lighting apparatus and a lens structure thereof.

Description of Related Art

A typical LED package has a fixed beam angle such as 120 degrees. In order to satisfy optical characteristics of various lighting module, a second lens is employed to cover the LED package to adjust the illumination distribution of the LED.

The LED package includes an LED chip, a reflective cup and a fluorescent material. The fluorescent material and the LED chip are encapsulated in the recess of the reflective cup. Because the LED package emits a light only through its top surface, the shapes of the light incident surface and the light outgoing surface of the second lens are designed only based on the illumination distribution of the top surface of the LED package.

In pace with the manufacturing progress, a fluorescent film is employed to direct cover the LED chip, and in such a configuration, the LED chip is not required to be encapsulated in the reflective cup. However, since the reflective cup is omitted, the lateral surface of the LED chip emits light to the circuit board, and this light will be reflected to the second lens, which causes unduly high brightness above the LED chip.

SUMMARY

The present invention prevents the unduly high brightness issue at the location above the light element caused by the light reflected by the circuit board.

In accordance with one embodiment of the present invention, a lighting apparatus includes a circuit board, a lighting element and a lens structure. The lighting element is disposed on the circuit board. The lighting element includes a lighting top surface and a lighting lateral surface. The lighting lateral surface is adjoined to the lighting top surface and the circuit board. The lighting top surface has a center and an optical axis. The optical axis passes through the center. The lens structure covers the lighting element for receiving a light from the lighting element. The lens structure includes an outer surface. The outer surface includes a total reflection portion and a light outgoing portion. The optical axis passes through the total reflection portion. The light outgoing portion surrounds the total reflection portion. The total reflection portion is configured to totally reflect a portion of light from the center. The light outgoing portion is configured to allow another light from the center to leave away from the lens structure.

In accordance with another embodiment of the present invention, a lens structure includes a bottom surface, an inner surface and an outer surface. The inner surface is caved in the bottom surface. The outer surface includes a total reflection portion and a light outgoing portion. The light outgoing portion surrounds the total reflection portion. A central axis of the lens structure and an imaginary coplanar plane coplanar with the bottom surface crosses at a crossover point. The total reflection portion substantially satisfies:

$$\angle Q2Q1Q3 = \arctan\left(\frac{\Delta R1}{R1 \cdot \Delta \theta 1}\right) > \arcsin\left(\frac{1}{n}\right).$$

Q1 is a first point on the total reflection portion. Q2 is a second point immediately adjacent to the first point. Q3 is a third point located on a connection line connecting the second point and the crossover point. A connection line connecting the third point and the first point is substantially perpendicular to a connection line connecting the crossover point and the first point. R1 is a distance from the crossover point to the first point. $\Delta R1$ is a distance from the second point to the third point. $\Delta \theta 1$ is an included angle defined by the connection line connecting the first point and the crossover point and the connection line connecting the second point and the crossover point. n is a refractive index of a material of the lens structure.

By the foregoing embodiment, because some lights emitted by the center of the lighting top surface of the lighting element is totally reflected by the total reflection portion, the brightness above the lighting element will not be unduly high even though the light emitted by the lighting lateral surface is reflected by the circuit board upwardly.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
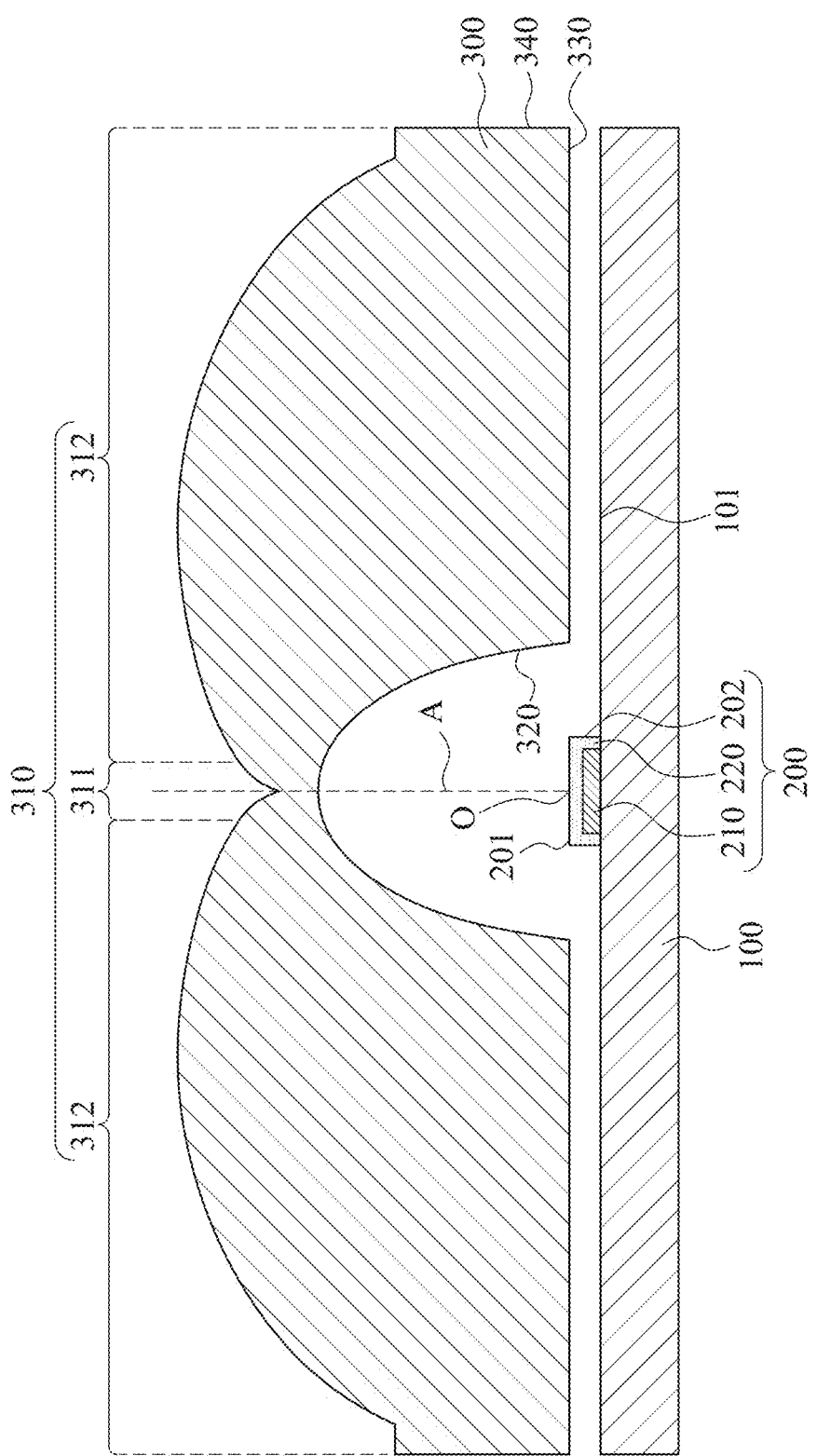
FIG. 1 is a cross-sectional view of a lighting apparatus in accordance with one embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a cross-sectional view of a lighting apparatus in accordance with one embodiment of the present invention. As shown in FIG. 1, in this embodiment, the lighting apparatus includes a circuit board 100, a lighting element 200 and a lens structure 300. The lighting element 200 is disposed on the circuit board 100, and it can be driven by the driving circuit (not shown) on the circuit board 100 to emit a light. The lens structure 300 covers the lighting element 200 for receiving a light from the lighting element 200 and adjusting the traveling path of the light, so as to generate a desired illumination distribution. The lighting element 200 has a lighting top surface 201 and a lighting lateral surface 202. The lighting lateral surface 202 is adjoined to the lighting top surface 201 and the circuit board 100. More particularly, the circuit board 100 has an upper surface 101 facing toward the lens structure 300. The lighting element 200 is disposed on the upper surface 101 of the circuit board 100, and the lighting lateral surface 202 is adjoined to the lighting top surface 201 and the upper surface 101 of the circuit board 100. The lighting top surface 201 and the lighting lateral surface 202 of the lighting element 200 both allow the light inside the lighting element 200 to be emitted outside the lighting element 200.

For example, in some embodiments, the lighting element 200 includes an LED chip 210 and a wavelength converting cover 220. The LED chip 210 is disposed on the upper surface 101 of the circuit board 100. In other words, the lower surface of the LED chip 210 is fixed on the upper surface 101 of the circuit board 100. The wavelength converting cover 220 covers other surfaces of the LED chip 210 (including top and lateral surfaces of the LED chip 210), so as to covert the wavelength of lights emitted by these surfaces of the LED chip 210, thereby obtaining lights having desired wavelength. Light emitted by these surfaces of the LED chip 210 travels through the wavelength converting cover 220 and travel out of the lateral and top surfaces of the wavelength converting cover 220. As such, the lateral surface of the wavelength converting cover 220 is the lighting lateral surface 202 of the lighting element 200, and the top surface of the wavelength converting cover 220 is the lighting top surface 201 of the lighting element 200. In some embodiment, the LED chip 210 can be, but is not limited to, a blue LED chip or an UV LED chip. The wavelength converting cover 220 can be, but is not limited to, a fluorescent film, which coverts some blue lights or UV lights to red, green or yellow light.

Because the lighting lateral surface 202 allows the light from the LED chip 210 to be emitted outwardly, and the lighting lateral surface 202 is adjoined to the top surface 101 of the circuit board 100, the light from the LED chip 210 may travel through the lighting lateral surface 202 to the upper surface 101 of the circuit board 100. When the light arrives at the upper surface 101 of the circuit board 101, it is reflected by the upper surface 101 upwardly, which causes unduly high brightness above the lighting element 200.

In order to address the unduly high brightness issue, the present invention provides the following solution. As shown in FIG. 1, the lens structure 300 includes an outer surface 310 and an inner surface 320 opposite to each other. The inner surface 320 is closer to the lighting element 200 than the outer surface 310 is, so that the light emitted by the lighting element 200 travels into the lens structure 300 through the inner surface 320 and leaves away from the lens structure 300 through the outer surface 310. In this embodiment, the outer surface 310 includes a total reflection portion 311 and a light outgoing portion 312. The lighting top surface 201 has a center O and an optical axis A. The optical axis A passes through the center O and is perpendicular to the lighting top surface 201. The optical axis A passes through the total reflection portion 311, and the light outgoing portion 312 surrounds the total reflection portion 311. When the lighting element 200 emits lights, the total reflection portion 311 totally reflects a portion of light from the center O of the lighting top surface 201, and the light outgoing portion 312 allows another light from the center O to leave away from the lens structure 300.

In the foregoing embodiment, because some light emitted by the center O of the lighting top surface 201 is totally reflected by the total reflection portion 311, the brightness above the lighting element 200 will not be unduly high even though the light emitted by the lighting lateral surface 202 is reflected by the upper surface 101 of the circuit board 100 upwardly.

Figure 2:
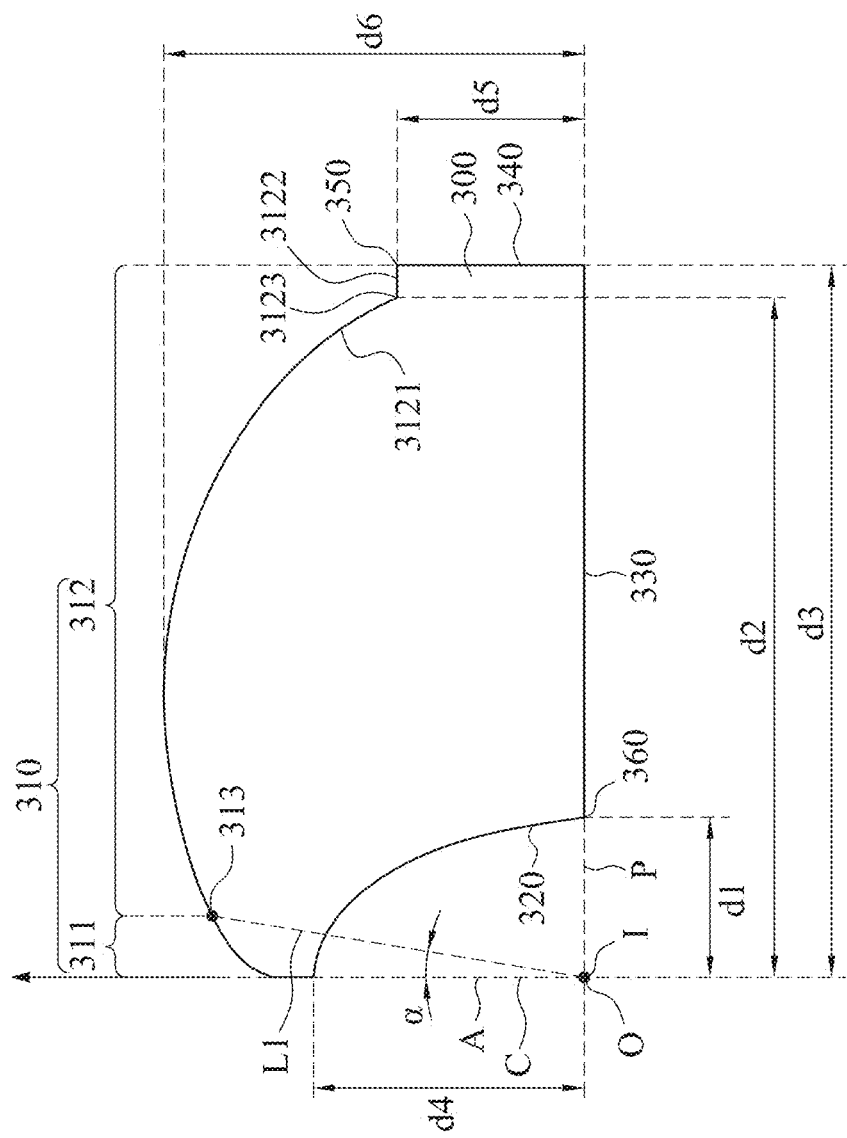
FIG. 2 is a fragmentary side view of the lens structure in FIG. 1.

FIG. 2 is a fragmentary side view of the lens structure 300 in FIG. 1. As shown in FIG. 2, the total reflection portion 311 and the light outgoing portion 312 cross at a boundary 313. In other words, a portion of the outer surface 310 between the boundary 313 and the optical axis A is the total reflection portion 311, and other portion of outer surface 310 is the light outgoing portion 312. The boundary 313 and the center O define an imaginary connection line L1. The imaginary connection line L1 and the optical axis A define an included angle α. The included angle α ranges from 6 degrees to 18 degrees. Because the included angle α determines the location of the boundary 313, it can determine the covering area that the total reflection portion 311 covers. In the covering area of the total reflection portion 311 based on the foregoing range of the included angle α, the brightness above the lighting element 200 (See FIG. 1) is not unduly high.

Figure 3:
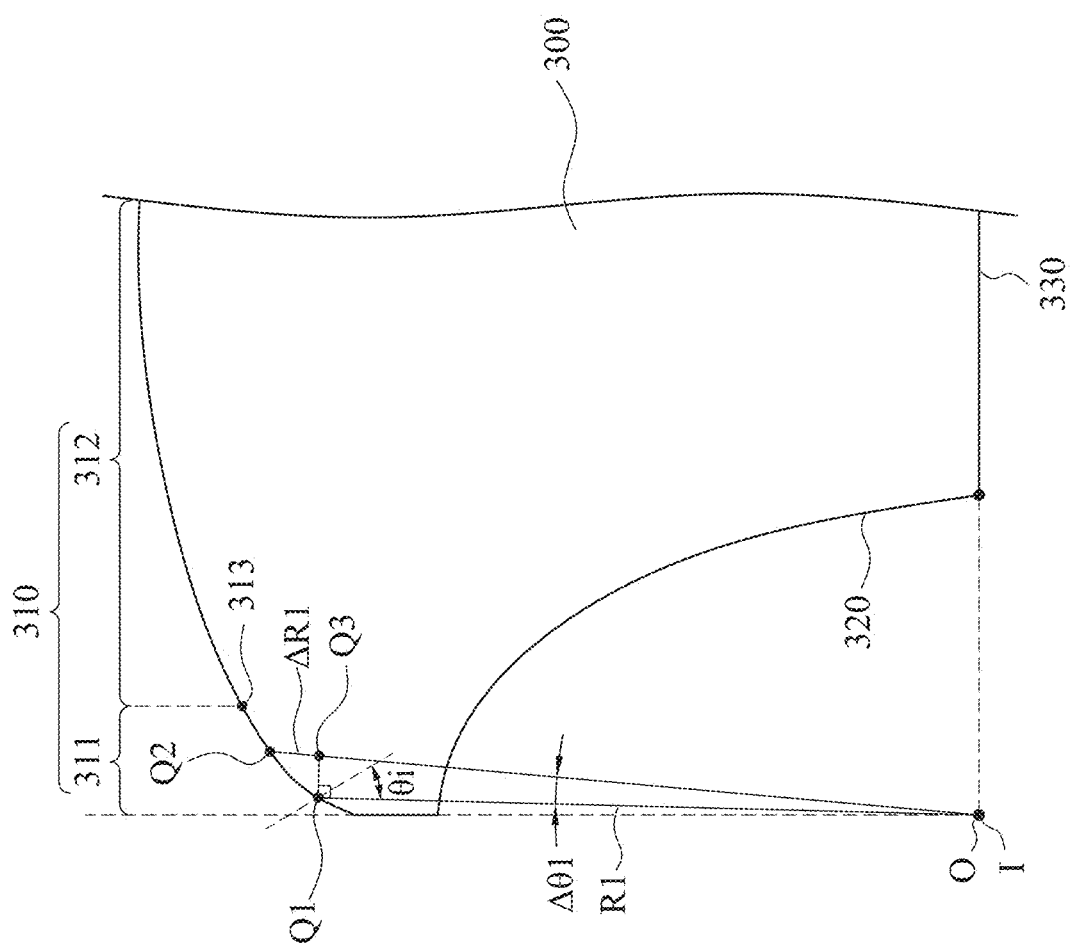
FIG. 3 is a fragmentary side view of the lens structure in FIG. 2.

In order to facilitate the total reflection portion 311 to totally reflect the light from the center O, in some embodiments, one embodiment of the present invention provides the following solution. Reference can be now made to FIG. 3, which is a fragmentary side view of the lens structure 300 in FIG. 2. As shown in FIG. 3, the total reflection portion 311 has a first point Q1 and a second point Q2. The first point Q1 and the second point Q2 are immediately adjacent to each other. It is understood that in this context, the description "two points are immediately adjacent to each other" means that the two points are arranged at an extremely short interval, such that the tangent plane of one point passes another point. For example, the second point Q2 and the first point Q1 are arranged at an extremely short interval, such that the tangent plane of the first point Q1 passes through the second point Q2. A third point Q3 can be determined on the connection line from the second point Q2 to the center O. The connection line connecting the third point Q3 and the first point Q1 is substantially perpendicular to a connection line connecting the center O and the first point Q1. R1 is a distance from the center O to the first point Q1. ΔR1 is a distance from the second point Q2 to the third point Q3. Δθ1 is an included angle defined by the connection line connecting the first point Q1 and the center O and the connection line connecting the second point Q2 and the center O. n is a refractive index of a material of the lens structure 300. The total reflection portion 311 substantially satisfies:

$$\angle Q2Q1Q3 = \arctan\left(\frac{\Delta R1}{R1 \cdot \Delta \theta 1}\right) > \arcsin\left(\frac{1}{n}\right).$$

When the total reflection portion 311 substantially satisfies the foregoing equation, the total reflection portion 311 can effectively totally reflect the light from the center O. The working principle is described as follows. The medium outside the outer surface 310 is air, in which the refractive index therefore is 1. The medium inside the outer surface 310 is the material of the lens structure 300, in which the refractive index is n. According to Snell's Law, when the light travels from the interior with respect to the outer surface 310 to the outer surface 310, refraction occurs. If the incident angle is $\theta_i$, and the refraction angle is $\theta t$, they satisfy: $n \times \sin\theta_i = 1 \times \sin\theta_t$. When a total reflection occurs, the refraction angle $\theta t$ is 90 degrees, and $n \times \sin\theta_i = 1 \times \sin 90° = 1$. Therefore, the incident angle satisfies:

$$\theta_i = \arcsin\left(\frac{1}{n}\right).$$

In such a situation, the incident angle $\theta_i$ is called the critical angle. Therefore, the incident angle $\theta_i$ preferably satisfies $$\theta_i > \arcsin\left(\frac{1}{n}\right),$$

so as to ensure that the total reflection occurs when the light travels from the interior with respect to the outer surface 310 to the outer surface 310. Further, because the connection line connecting the third point Q3 and the first point Q1 is substantially perpendicular to the traveling direction of the incident light, the incident angle $\theta_i$ is equal to the angle $\angle Q2Q1Q3$. Therefore, when satisfying $$\angle Q2Q1Q3 > \arcsin\left(\frac{1}{n}\right),$$

the total reflection occurs when the light emitted from the center O arrives at the outer surface 311. Moreover, because the first point Q1 and the second point Q2 are arranged at an extremely short interval, the $\Delta\theta 1$ is extremely small, and therefore, the distance from the first point Q1 to the third point Q3 is about $R1 \cdot \Delta\theta 1$. As a result, the angle $\angle Q2Q1Q3$ satisfies:

$$\angle Q2Q1Q3 = \arctan\left(\frac{\Delta R1}{R1 \cdot \Delta\theta 1}\right).$$

Based on the foregoing principle, as long as the total reflection portion 311 satisfies:

$$\angle Q2Q1Q3 = \arctan\left(\frac{\Delta R1}{R1 \cdot \Delta\theta 1}\right) > \arcsin\left(\frac{1}{n}\right),$$

the total reflection occurs when the light emitted by the center O arrives at the outer surface 310, thereby addressing the unduly high brightness issue above the lighting element 200.

Figure 4:
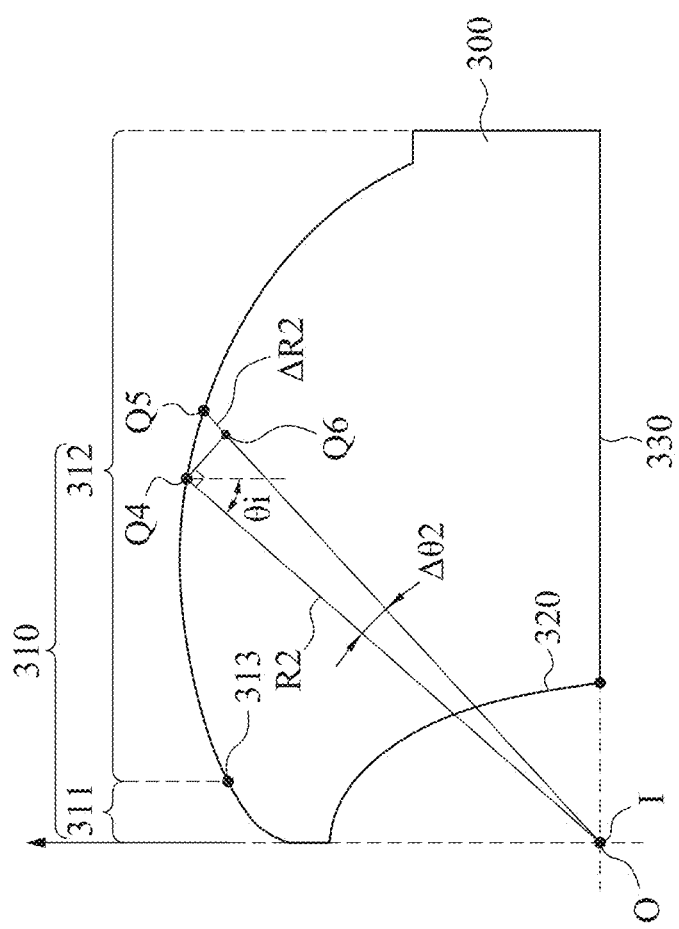
FIG. 4 is a fragmentary side view of the lens structure in FIG. 2.

In order to facilitate the light outgoing portion 312 to allow the light emitted by the center O to leave away from the outer surface 310, one embodiment of the present invention provides the following solution. Reference can be now made to FIG. 4, which is a fragmentary side view of the lens structure 300 in FIG. 2. As shown in FIG. 4, the light outgoing portion 312 has a fourth point Q4 and a fifth point Q5. The fourth point Q4 and the fifth point Q5 are immediately adjacent to each other. More particularly, the fifth point Q5 and the fourth point Q4 are arranged at an extremely short interval, such that the tangent plane of the first point Q4 passes through the second point Q5. A sixth point Q6 can be determined on the connection line from the fifth point Q5 to the center O. The connection line connecting the sixth point Q6 and the fourth point Q4 is substantially perpendicular to a connection line connecting the center O and the fourth point Q4. R2 is a distance from the center O to the fourth point Q4. $\Delta R2$ is a distance from the fifth point Q5 to the sixth point Q6. $\Delta\theta 2$ is an included angle defined by the connection line connecting the fourth point Q4 and the center O and the connection line connecting the fifth point Q5 and the center O. The light outgoing portion 312 substantially satisfies:

$$\angle Q5Q4Q6 = \arctan\left(\frac{\Delta R2}{R2 \cdot \Delta\theta 2}\right) < \arcsin\left(\frac{1}{n}\right).$$

When the light outgoing portion 312 substantially satisfies the foregoing equation, the light outgoing portion 312 allows the light from the center O to leave away from the outer surface 310. The working principle is described as follows. The medium outside the outer surface 310 is air, in which the refractive index therefore is 1. The medium inside the outer surface 310 is the material of the lens structure 300, in which the refractive index is n. According to Snell's Law, when incident angle $\theta_i$ of which the light arrives at the outer surface 310 satisfies:

$$\theta_i = \arcsin\left(\frac{1}{n}\right),$$

the total reflection occurs so that the light cannot leave away from the outer surface 310. Therefore, the incident angle $\theta_i$ preferably satisfies $$\theta_i < \arcsin\left(\frac{1}{n}\right),$$

so as to ensure that the light can leave away from the outer surface 310 in a refraction manner when the light travels from the interior with respect to the outer surface 310 to the outer surface 310. Further, because the connection line connecting the sixth point Q6 and the fourth point Q4 is substantially perpendicular to the traveling direction of the incident light, the incident angle $\theta_i$ is equal to the angle $\angle Q5Q4Q6$. Therefore, when satisfying $$\angle Q5Q4Q6 < \arcsin\left(\frac{1}{n}\right),$$

the light emitted by the center O can be refracted from the interior with respect to the outer surface 310 to the exterior with respect to the outer surface 310. Moreover, because the fourth point Q4 and the fifth point Q5 are arranged at an extremely short interval, the $\Delta\theta 2$ is extremely small, and therefore, the distance from the fourth point Q4 to the sixth point Q6 is about $R2 \cdot \Delta\theta 2$. As a result, the angle $\angle Q5Q4Q6$ satisfies:

$$\angle Q5Q4Q6 = \arctan\left(\frac{\Delta R2}{R2 \cdot \Delta\theta 2}\right).$$

Based on the foregoing principle, as long as the light outgoing portion 312 satisfies:

$$\angle Q5Q4Q6 = \arctan\left(\frac{\Delta R2}{R2 \cdot \Delta\theta 2}\right) < \arcsin\left(\frac{1}{n}\right),$$

the light emitted by the center O can be refracted out of the outer surface 310 when the light arrives at the outer surface 310, thereby facilitating lighting.

In some embodiments, as shown in FIG. 2, the lens structure 300 has a central axis C. The central axis C overlaps with the optical axis A of the lighting top surface 201 (See FIG. 1). In other words, the lens structure 300 is axisymmetrical with respect to the optical axis A of the lighting top surface 201. The lens structure 300 includes a bottom surface 330 and a lateral surface 340. The inner surface 320 is caved in the bottom surface 330. The lateral surface 340 is adjoined to the outer surface 310 and the bottom surface 330. The bottom surface 330 has an imaginary coplanar plane P. The imaginary coplanar plane P means an imaginary plane extending from the bottom surface 330, which is coplanar with the bottom surface 330. The central axis C and the imaginary coplanar plane P coplanar with the bottom surface 330 cross at a crossover point I. The crossover point I overlaps with the center O of the lighting top surface 201. In other words, in FIG. 3, the third point Q3 is also located on the connection line connecting the second point Q2 and the crossover point I. The connection line connecting the third point Q3 and the first point Q1 is also substantially perpendicular to the connection line connecting the crossover point I and the first point Q1. R1 is also a distance from the crossover point I to the first point Q1. $\Delta\theta 1$ is also an included angle defined by the connection line connecting the first point Q1 and the crossover point I and the connection line connecting the second point Q2 and the crossover point I. Moreover, in FIG. 4, the sixth point Q6 is also located on the connection line connecting the firth point Q5 and the crossover point I. The connection line connecting the sixth point Q6 and the fourth point Q4 is substantially perpendicular to the connection line connecting the crossover point I and the fourth point Q4. R2 is also a distance from the crossover point I to the fourth point Q4. $\Delta\theta 2$ is an included angle defined by the connection line connecting the fourth point Q4 and the crossover point I and the connection line connecting the fifth point Q5 and the crossover point I.

In some embodiments, as shown in FIG. 2, the outer surface 310 substantially satisfies:

$$Y=-0.0004X^6+0.0090X^5-0.0790X^4+0.3410X^3-0.8387X^2+1.3205X+3.52.$$

Y is a distance from any point on the outer surface 310 to the center O (or the crossover point I) measured along a direction parallel to the optical axis A (or the central axis C), namely, the longitudinal distance in FIG. 2, X is a distance from the point on the outer surface 310 to the optical axis A measured along a direction perpendicular to the optical axis A, namely, the transversal distance in FIG. 2. When the outer surface 310 substantially satisfies the foregoing equation, the total reflection portion 311 can reflect the light emitted by the center O in a total reflection manner, and the light outgoing portion 312 can allow the light emitted by the center O to leave away from the outer surface 310.

In some embodiments, as shown in FIG. 2, the inner surface substantially satisfies:

$$y=-1.395x^5+5.113x^4-6.742x^3+3.060x^2-0.698x+3.$$

y is a distance from any point on the inner surface 320 to the center O (or the crossover point I) measured along a direction parallel to the optical axis A (or the central axis C), namely, the longitudinal distance in FIG. 2, x is a distance from the point on the inner surface 320 to the optical axis A (or the central axis C) measured along a direction perpendicular to the optical axis A (or the central axis C), namely, the transversal distance in FIG. 2. When the inner surface 320 substantially satisfies the foregoing equation, and the outer surface 310 substantially satisfies:

$$Y=-0.0004X^6+0.0090X^5-0.0790X^4+0.3410X^3-0.8387X^2+1.3205X+3.52,$$

it is preferably to ensure the total reflection portion 311 to totally reflect the light emitted by the center O, and to ensure the light outgoing portion allows the light emitted by the center O to leave away from the outer surface 310.

In some embodiments, as shown in FIG. 2, the inner surface 320 is a curved surface, the transversal distance from any point on this curved surface to the center O (or the crossover point I) is inversely proportional to the longitudinal distance from this point to the center O (or the crossover point I). The light outgoing portion 312 includes a curved zone 3121 and a planar zone 3122. The curved zone 3121 is adjoined between the total reflection portion 311 and the planar zone 3122. The planar zone 3122 is adjoined to the lateral surface 340. The curved zone 3121 and the planar zone 3122 cross at a boundary 3123. The planar zone 3122 and the lateral surface 340 cross at a boundary 350. The inner surface 320 and the bottom surface 330 cross at a boundary 360. A distance d1 is defined from the boundary 360 to the optical axis A (or the central axis C) along the direction perpendicular to the optical axis A (or the central axis C). A distance d2 is defined from the boundary 3123 to the optical axis A (or the central axis C) along the direction perpendicular to the optical axis A (or the central axis C). A distance d3 is defined from the boundary 350 to the optical axis A (or the central axis C) along the direction perpendicular to the optical axis A (or the central axis C). The relationship among the distances d1, d2 and d3 preferably satisfies: 4≤d2/d1≤6, and d3>d2. This relationship effectively enables the light to be totally reflected by the total reflection portion 311, and effectively enables the light to leave away from the lens structure 300 through the light outgoing portion 312.

In some embodiments, as shown in FIG. 2, the maximal distance from the inner surface 320 to the center O (or the crossover point I) measured along the direction parallel to the optical axis A (or the central axis C) is the distance d4. A distance d5 is defined from the planar zone 3122 to the center O (or the crossover point I) along the direction parallel to the optical axis A (or the central axis C). The maximal distance from the outer surface 310 to the center O (or the crossover point I) along the direction parallel to the optical axis A (or the central axis C) is the distance d6. The relationship among the distances d4, d5 and d6 preferably satisfies: 1.2≤d6/d4≤1.8, and d5>0.5 mm. This relationship effectively enables the light to be totally reflected by the total reflection portion 311, and effectively enables the light to leave away from the lens structure 300 through the light outgoing portion 312.

In some embodiments, a material of the lens structure 300 is a light permeable plastic material which has a refractive index ranging from 1.45 to 1.65. It is understood that "a value ranging from A to B" in this context not only means that this value can be any value higher than A and lower than B, but also means that this value can be equal to A or equal to B.

Figure 5:
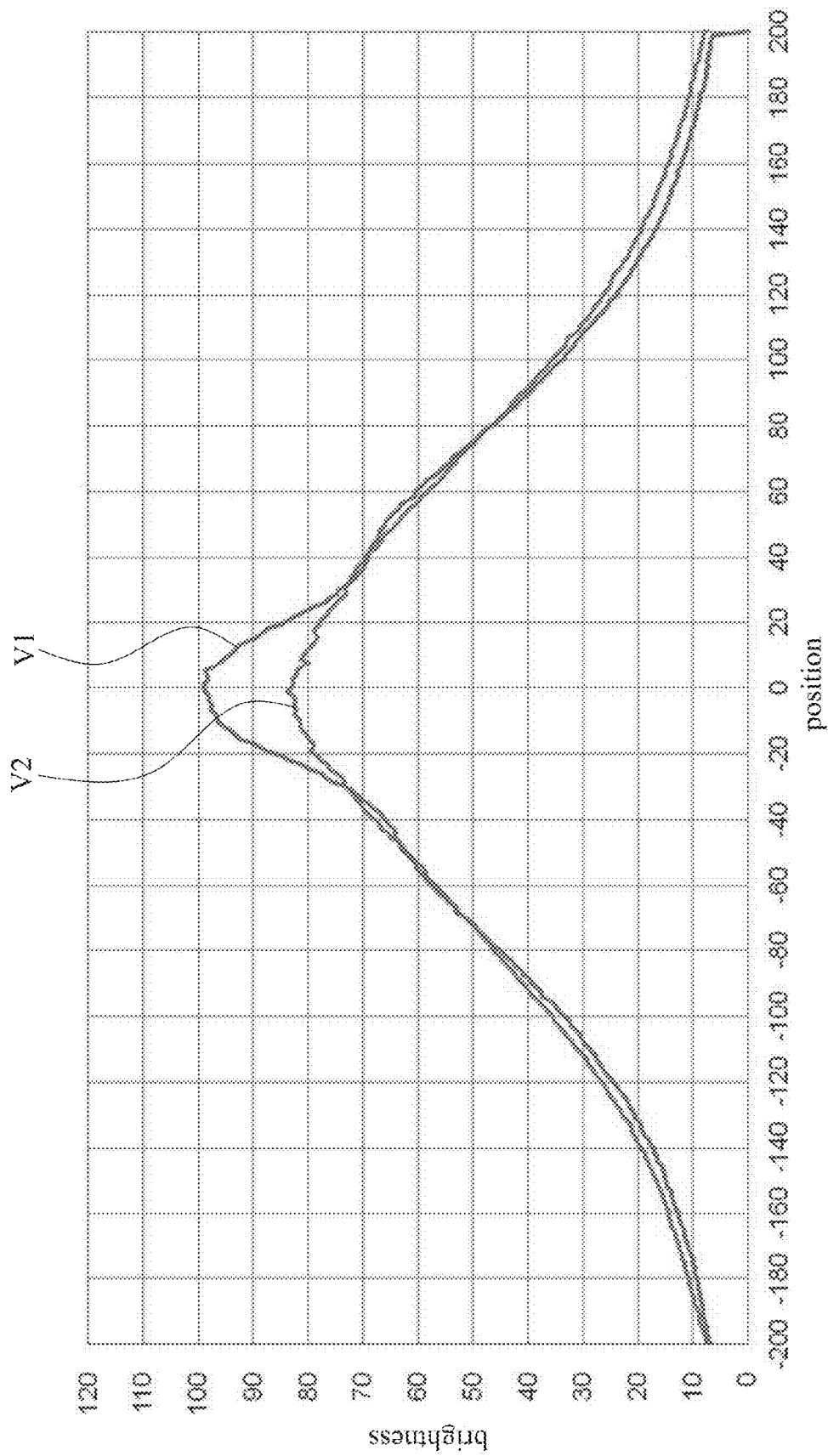
FIG. 5 is a brightness distribution comparison chart in accordance one experimental result of the present invention.

FIG. 5 is a brightness distribution comparison chart in accordance one experimental result of the present invention. As shown in FIG. 5, the traditional curve V1 is a brightness distribution curve of a traditional lighting apparatus employing a traditional lens structure without total reflection portion, and the improved curve V2 is a brightness distribution curve of the lighting apparatus employing the lens structure 300 in accordance with the present invention. It can be acknowledged that the central portion of the traditional curve V1 significantly raises, which means that the brightness above the lighting element 200 is unduly high; contrarily, the improved curve V2 does not significantly raise, which means that the brightness above the lighting element 200 is not unduly high. Therefore, the lens structure 300 can effectively address the issue of the unduly high brightness above the lighting element 200.

Figure 6:
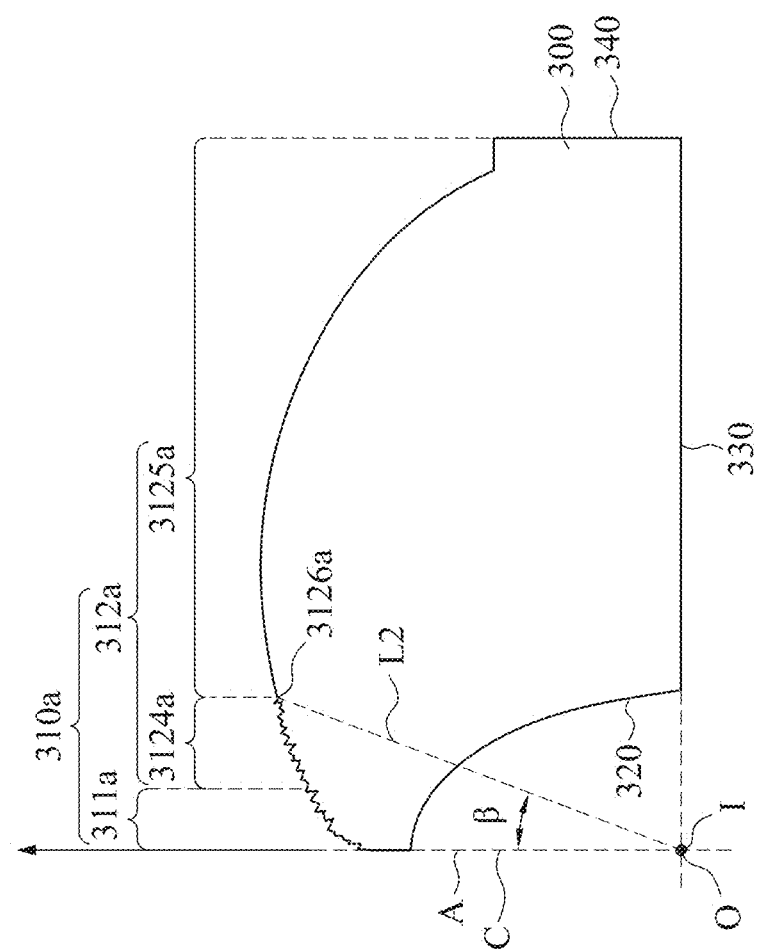
FIG. 6 is a fragmentary side view of the lighting apparatus in accordance with another embodiment of the present invention.

FIG. 6 is a fragmentary side view of the lighting apparatus in accordance with another embodiment of the present invention. As shown in FIG. 6 the main difference between this embodiment and the previous embodiments is that the outer surface 310a is partially rough, while the foregoing outer surface 310 is smooth. In particular, the total reflection portion 311a of the outer surface 310a is rough. For example, the total reflection portion 311a has a roughness of between VDI 10 to 30. The "VDI" in this context is the surface roughness value regulated by Verein Deutscher Ingenieure, the Society of German Engineers. By making the total reflection portion 311a rough, the brightness distribution curve can be smoother.

In some embodiments, as shown in FIG. 6, not only the whole total reflection portion 311a is rough, but also the light outgoing portion 312 is partially rough. In particular, the light outgoing portion 312a has a rough zone 3124a and a smooth zone 3125a. The rough zone 3124a is adjoined between the smooth zone 3125a and the total reflection portion 311a. In other words, a zone of the light outgoing portion 312a that is closer to the total reflection portion 311a is rough, and a zone of the light outgoing portion 312a that is farther away from the total reflection portion 311a is smooth. The rough zone 3124a is rougher than the smooth zone 3125a. For example, the rough zone 3124a has a roughness of between VDI 10 to 30. The rough zone 3124a and the smooth zone 3125a cross at a boundary 3126a. The center O (or the crossover point I) and the boundary 3126a define an imaginary connection line L2. The imaginary connection line L2 and the optical axis A (or the central axis C) define an included angle β, the included angle β is less than 36 degrees. The included angle β defines the location of the crossover boundary 3126a, thereby defining the covering area covered by the rough total reflection portion 311a and the rough zone 3124a. In the covering area of the total reflection portion 311a and the rough zone 3124a, the illumination distribution can be smoother.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A lighting apparatus, comprising:
a circuit board;
a lighting element disposed on the circuit board, the lighting element comprising a lighting top surface and a lighting lateral surface, the lighting lateral surface adjoined to the lighting top surface and the circuit board, the lighting top surface having a center and an optical axis, the optical axis passing through the center; and
a lens structure covering the lighting element for receiving a light from the lighting element, the lens structure comprising an outer surface, the outer surface comprising a total reflection portion and a light outgoing portion, the optical axis passing through the total reflection portion, the light outgoing portion surrounding the total reflection portion, the total reflection portion being configured to totally reflect a portion of light from the center, the light outgoing portion being configured to allow another light from the center to leave away from the lens structure, wherein the total reflection portion of the outer surface is rough,
wherein the light outgoing portion has a rough zone and a smooth zone, and the rough zone is adjoined between the smooth zone and the total reflection portion, the center and a boundary between the rough zone and the smooth zone define an imaginary connection line, the imaginary connection line and the optical axis define an included angle, the included angle is less than 36 degrees.

2. The lighting apparatus of claim 1, wherein the center and a boundary between the total reflection portion and a light outgoing portion define an imaginary connection line, the imaginary connection line and the optical axis define an included angle, the included angle ranges from 6 degrees to 18 degrees.

3. The lighting apparatus of claim 1, wherein the total reflection portion substantially satisfies:

$$\angle Q2Q1Q3 = \arctan\left(\frac{\Delta R1}{R1 \cdot \Delta\theta1}\right) > \arcsin\left(\frac{1}{n}\right),$$

wherein Q1 is a first point on the total reflection portion, and Q2 is a second point immediately adjacent to the first point, and Q3 is a third point located on a connection line connecting the second point and the center, and a connection line connecting the third point and the first point is substantially perpendicular to a connection line connecting the center and the first point, R1 is a distance from the center to the first point, $\Delta R1$ is a distance from the second point to the third point, $\Delta\theta1$ is an included angle defined by the connection line connecting the first point and the center and the connection line connecting the second point and the center, and n is a refractive index of a material of the lens structure.

4. The lighting apparatus of claim 1, wherein the light outgoing portion substantially satisfies:

$$\angle Q5Q4Q6 = \arctan\left(\frac{\Delta R2}{R2 \cdot \Delta\theta2}\right) < \arcsin\left(\frac{1}{n}\right),$$

wherein Q4 is a fourth point on the light outgoing portion, and Q5 is a fifth point immediately adjacent to the fourth point, and Q6 is a sixth point located on a connection line connecting the fifth point and the center, and a connection line connecting the sixth point and the fourth point is substantially perpendicular to a connection line connecting the center and the fourth point, R2 is a distance from the center to the fourth point, ΔR2 is a distance from the fifth point to the sixth point, Δθ2 is an included angle defined by the connection line connecting the fourth point and the center and the connection line connecting the fifth point and the center, and n is a refractive index of a material of the lens structure.

5. The lighting apparatus of claim 1, wherein the outer surface substantially satisfies:

$$Y=-0.0004X^6+0.0090X^5-0.0790X^4+0.3410X^3-0.8387X^2+1.3205X+3.52,$$

wherein Y is a distance from any point on the outer surface to the center measured along a direction parallel to the optical axis, X is a distance from the point on the outer surface to the optical axis measured along a direction perpendicular to the optical axis.

6. The lighting apparatus of claim 5, wherein the lens structure comprises an inner surface opposite to the outer surface, the inner surface substantially satisfies:

$$y=-1.395x^5+5.113x^4-6.742x^3+3.060x^2-0.698x+3,$$

wherein y is a distance from any point on the inner surface to the center measured along a direction parallel to the optical axis, x is a distance from the point on the inner surface to the optical axis measured along a direction perpendicular to the optical axis.

7. The lighting apparatus of claim 1, wherein the total reflection portion has a roughness of between VDI 10 to 30.

8. The lighting apparatus of claim 1, wherein the rough zone has a roughness of between VDI 10 to 30.

9. A lens structure, comprising:
a bottom surface;
an inner surface caved in the bottom surface; and
an outer surface comprising a total reflection portion and a light outgoing portion surrounding the total reflection portion, wherein a central axis of the lens structure and an imaginary coplanar plane coplanar with the bottom surface crosses at a crossover point, and the total reflection portion substantially satisfies:

$$\angle Q2Q1Q3 = \arctan\left(\frac{\Delta R1}{R1 \cdot \Delta\theta1}\right) > \arcsin\left(\frac{1}{n}\right),$$

wherein Q1 is a first point on the total reflection portion, and Q2 is a second point immediately adjacent to the first point, and Q3 is a third point located on a connection line connecting the second point and the crossover point, and a connection line connecting the third point and the first point is substantially perpendicular to a connection line connecting the crossover point and the first point, R1 is a distance from the crossover point to the first point, ΔR1 is a distance from the second point to the third point, Δθ1 is an included angle defined by the connection line connecting the first point and the crossover point and the connection line connecting the second point and the crossover point, and n is a refractive index of a material of the lens structure, wherein the total reflection portion of the outer surface is rough, wherein the light outgoing portion has a rough zone and a smooth zone, and the rough zone is adjoined between the smooth zone and the total reflection portion, the crossover point and a boundary between the rough zone and the smooth zone define an imaginary connection line, the imaginary connection line and the central axis define an included angle, the included angle is less than 36 degrees.

10. The lens structure of claim 9, wherein the crossover point and a boundary between the total reflection portion and a light outgoing portion define an imaginary connection line, the imaginary connection line and the central axis define an included angle, the included angle ranges from 6 degrees to 18 degrees.

11. The lens structure of claim 9, wherein the light outgoing portion substantially satisfies:

$$\angle Q5Q4Q6 = \arctan\left(\frac{\Delta R2}{R2 \cdot \Delta\theta2}\right) < \arcsin\left(\frac{1}{n}\right),$$

wherein Q4 is a fourth point on the light outgoing portion, and Q5 is a fifth point immediately adjacent to the fourth point, and Q6 is a sixth point located on a connection line connecting the fifth point and the crossover point, and a connection line connecting the sixth point and the fourth point is substantially perpendicular to a connection line connecting the crossover point and the fourth point, R2 is a distance from the crossover point to the fourth point, ΔR2 is a distance from the fifth point to the sixth point, and Δθ2 is an included angle defined by the connection line connecting the fourth point and the crossover point and the connection line connecting the fifth point and the crossover point.

12. The lens structure of claim 9, wherein the outer surface substantially satisfies:

$$Y=-0.0004X^6+0.0090X^5-0.0790X^4+0.3410X^3-0.8387X^2+1.3205X+3.52,$$

wherein Y is a distance from any point on the outer surface to the bottom surface measured along a direction parallel to the central axis, X is a distance from the point on the outer surface to the central axis measured along a direction perpendicular to the central axis.

13. The lens structure of claim 12, wherein the inner surface substantially satisfies:

$$y=-1.395x^5+5.113x^4-6.742x^3+3.060x^2-0.698x+3,$$

wherein y is a distance from any point on the inner surface to the bottom surface measured along a direction parallel to the central axis, x is a distance from the point on the inner surface to the central axis measured along a direction perpendicular to the central axis.

14. The lens structure of claim 9, wherein the total reflection portion has a roughness of between VDI 10 to 30.

15. The lens structure of claim 9, wherein the rough zone has a roughness of between VDI 10 to 30.

* * * * *